(12) United States Patent
Kim et al.

(10) Patent No.: US 8,541,771 B2
(45) Date of Patent: Sep. 24, 2013

(54) SEMICONDUCTOR DEVICE AND METHOD OF MANUFACTURING THE SAME

(75) Inventors: Jun-youn Kim, Hwaseong-si (KR); Su-hee Chae, Suwon-si (KR); Hyun-gi Hong, Suwon-si (KR); Young-jo Tak, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 195 days.

(21) Appl. No.: 13/157,681

(22) Filed: Jun. 10, 2011

(65) Prior Publication Data
US 2012/0153261 A1    Jun. 21, 2012

(30) Foreign Application Priority Data

Dec. 17, 2010   (KR) .................. 10-2010-0130001

(51) Int. Cl.
*H01L 29/06*      (2006.01)
*H01L 31/072*     (2012.01)
*H01L 31/109*     (2006.01)
*H01L 31/0328*    (2006.01)
*H01L 31/0336*    (2006.01)

(52) U.S. Cl.
USPC .................. 257/18; 257/E29.072; 438/507

(58) Field of Classification Search
USPC .................. 257/18, E29.072; 438/597, 507
See application file for complete search history.

(56) References Cited

U.S. PATENT DOCUMENTS

| | | | |
|---|---|---|---|
| 6,500,488 B1 * | 12/2002 | Chang et al. .................. 51/307 |
| 2004/0200406 A1 | 10/2004 | Peczalski et al. |
| 2008/0248633 A1 * | 10/2008 | Jiang et al. .................. 438/483 |
| 2008/0296616 A1 | 12/2008 | Li et al. |
| 2010/0044719 A1 * | 2/2010 | Yu et al. .......................... 257/76 |
| 2011/0056429 A1 * | 3/2011 | Raring et al. ................ 117/101 |
| 2011/0189837 A1 * | 8/2011 | Yu et al. ....................... 438/478 |

FOREIGN PATENT DOCUMENTS

| | | |
|---|---|---|
| JP | 2000277803 A | 10/2000 |
| JP | 2005079260 A | 3/2005 |
| KR | 1020010062441 | 7/2001 |
| KR | 1020100022663 | 3/2010 |
| KR | 1020100032513 | 3/2010 |

* cited by examiner

*Primary Examiner* — Phuc Dang
(74) *Attorney, Agent, or Firm* — Harness, Dickey & Pierce, P.L.C.

(57) ABSTRACT

Example embodiments relate to a semiconductor device and a method of manufacturing the semiconductor device. The semiconductor device may include a pre-seeding layer and a nucleation layer. The pre-seeding layer may include a first material for pre-seeding and a second material for masking so as to reduce tensile stress.

25 Claims, 6 Drawing Sheets

SEMICONDUCTOR DEVICE AND METHOD OF MANUFACTURING THE SAME

CROSS-REFERENCE TO RELATED APPLICATION

This application claims priority under 35 U.S.C. §119 to Korean Patent Application No. 10-2010-0130001, filed on Dec. 17, 2010 in the Korean Intellectual Property Office, the disclosure of which is incorporated herein in its entirety by reference.

BACKGROUND

1. Field

The present disclosure relates to semiconductor devices that have been configured to reduce generation of cracks by reducing a tensile stress, and methods of manufacturing the semiconductor devices.

2. Description of the Related Art

Nitride-based semiconductor devices may use a sapphire substrate. However, a sapphire substrate is relatively costly and has a relatively low electric conductivity. Also, the hardness of a sapphire substrate may make it relatively difficult for the manufacture of chips. Additionally, the manufacture of a relatively large sapphire substrate may be complicated by its tendency to warp at relatively high temperatures due to its relatively low heat conductivity in an epitaxial growth process. In order to reduce or prevent the above problems, nitride-based semiconductor devices using a silicon (Si) substrate, instead of a sapphire substrate, are being developed.

Since a Si substrate has a higher heat conductivity than that of a sapphire substrate and thus is not warped as much even at a relatively high temperature for growing a nitride thin film, a relatively large thin film may be grown on the Si substrate. However, when a nitride thin film is grown on the Si substrate, a dislocation density may be increased due to a mismatch of lattice constants, and a tensile stress may be generated in the nitride thin film so as to generate cracks due to a mismatch of thermal expansion coefficients between the nitride thin film and the Si substrate. As a method of preventing cracks from being generated, a compressive stress is applied to the nitride thin film to compensate for the tensile stress generated due to the mismatch of thermal expansion coefficients.

SUMMARY

Example embodiments relate to semiconductor devices that have reduced cracks as a result of reducing a tensile stress when a nitride semiconductor layer is grown.

Example embodiments also relate to methods of manufacturing the semiconductor devices, by which a tensile stress is reduced when a nitride semiconductor layer is grown.

Additional aspects will be set forth in part in the description which follows and, in part, will be apparent from the description, or may be learned by practice of example embodiments.

According to example embodiments of the present invention, a semiconductor device may include a pre-seeding layer including a first material and a second material that is distinct from the first material, the first material having properties that facilitate pre-seeding and the second material having properties that facilitate masking; a nucleation layer grown on the pre-seeding layer; and a nitride semiconductor layer grown on the nucleation layer.

The first material may include aluminum (Al).

The second material may include magnesium (Mg) or silicon (Si).

The nitride semiconductor layer may include a nitride containing gallium.

The nucleation layer may include AlN.

The semiconductor device may further include at least one buffer layer disposed between the nucleation layer and the nitride semiconductor layer.

The at least one buffer layer may include $Al_xIn_yGa_{1-x-y}N$, ($0 \leq x$, $y \leq 1$, $x+y \leq 1$).

The semiconductor device may further include at least one masking layer disposed between the nucleation and the nitride semiconductor layer.

The semiconductor device may further include at least one inter layer disposed on the at least one masking layer and configured to compensate for a tensile stress.

The at least one masking layer may be grown and may include silicon nitride ($SiN_x$) or titanium nitride (TiN).

The at least one inter layer may include a material including any one selected from the group consisting of $Al_{x0}In_{y0}Ga_{1-x0-y0}N$ ($0 \leq x0$, $y0 \leq 1$, $x0+y0 \leq 1$), step graded $Al_xIn_yGa_{1-x-y}N$ ($0 \leq x$, $y \leq 1$, $x+y \leq 1$), and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$) superlattice.

The semiconductor device may further include a substrate below the nitride semiconductor layers.

The substrate may include a silicon (Si) substrate or a silicon carbide (SIC) substrate.

The nucleation layer may include Mg or Si.

The semiconductor device may further include another pre-seeding layer on the nucleation layer and including a first material for pre-seeding and a second material for masking, and another nucleation layer grown the pre-seeding layer.

According to example embodiments of the present invention, a method of manufacturing a semiconductor device may include growing a pre-seeding layer on a substrate, the pre-seeding layer including a first material and a second material that is distinct from the first material, the first material having properties that facilitate pre-seeding and the second material having properties that facilitate masking; growing a nucleation layer on the pre-seeding layer; and growing a nitride semiconductor layer on the nucleation layer.

BRIEF DESCRIPTION OF THE DRAWINGS

The above and/or other aspects of example embodiments will become apparent and more readily appreciated when the following description is taken in conjunction with the accompanying drawings of which.

DETAILED DESCRIPTION

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor device and a method of manufacturing the semiconductor device will be described in further detail with regard to example embodiments of the invention with reference to the attached drawings. In the drawings, like reference numerals in the drawings denote like elements, and the thicknesses of layers and regions may have been exaggerated for clarity. In this regard, it should be understood that the examples herein may have different forms and should not be construed as being limited to the descriptions set forth herein.

Figure 1:
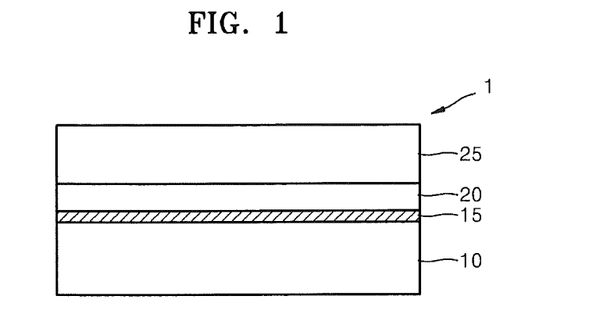
FIG. 1 is a cross-sectional view of a semiconductor device according to example embodiments of the present invention.

FIG. 1 is a cross-sectional view of a semiconductor device 1 according to example embodiments of the present invention. Referring to FIG. 1, the semiconductor device 1 may include a substrate 10, a pre-seeding layer 15 on the substrate 10, and a nucleation layer 20 on the pre-seeding layer 15. At least one nitride semiconductor layer 25 may be disposed on the nucleation layer 20.

The substrate 10 may be, for example, a silicon-based substrate. For example, the substrate 10 may include a silicon (Si) substrate or a silicon carbide (SiC) substrate. The Si substrate may use, for example, a (111) surface. The substrate 10 may be cleaned by a mixture of sulfuric acid and oxygenated water, hydrofluoric acid (HF), deionized water, or the like. Impurities (e.g., metal, organic materials, or the like), native oxide from the substrate 10, and a surface of the substrate 10 may be terminated with hydrogen so that a state of the substrate 10 may be improved for epitaxial growth. The substrate 10 may be removed during or after the manufacture of the semiconductor device 1.

Figure 2:
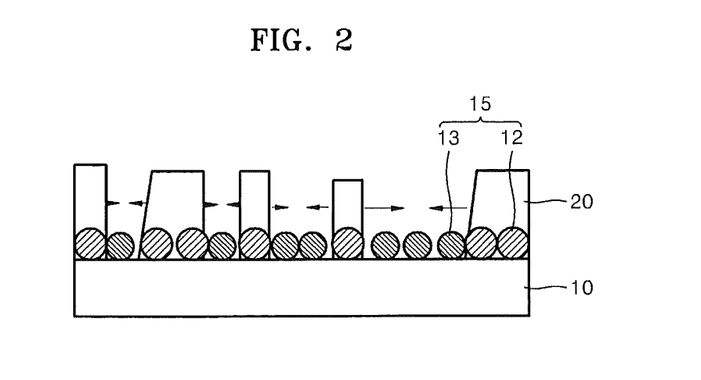
FIG. 2 is an enlarged diagram of a pre-seeding layer according to example embodiments of the present invention.

FIG. 2 is an enlarged diagram of the pre-seeding layer 15 according to example embodiments of the present invention. The pre-seeding layer 15 may include a first material 12 for pre-seeding, and a second material 13 for masking. The pre-seeding layer 15 may be preliminarily formed on the substrate 10 prior to forming the nucleation layer 20. The nucleation layer 20 may be grown on the first material 12, whereas the nucleation layer 20 may not be grown on the second material 13. Thus, a contact area between the nucleation layer 20 and the substrate 10 may be reduced. A tensile stress may be generated due to a mismatch of lattice constants between the substrate 10 and the nucleation layer 20, but the tensile stress of the nucleation layer 20 may be reduced when the contact area between the nucleation layer 20 and the substrate 10 is reduced. Likewise, when the tensile stress of the nucleation layer 20 is reduced, a compressive stress (shown by arrows in FIG. 2) may be applied accordingly.

For example, the first material 12 may include aluminum (Al). The second material 13 may include magnesium (Mg) or silicon (Si). The nucleation layer 20 may be formed of, for example, AlN. The nucleation layer 20 may reduce or prevent the melt-back generated when the substrate 10 and nitride semiconductor layer 25 react with each other so that wetting may be performed on the nitride semiconductor layer 25 that is to be grown later.

The nucleation layer 20 may be partially grown by the pre-seeding layer 15 and may be subsequently coalesced. The at least one nitride semiconductor layer 25 may be disposed on the nucleation layer 20. The tensile stress in the nucleation layer 20 may be reduced, and the compressive stress may be applied to the nitride semiconductor layer 25 grown on the nucleation layer 20 accordingly. Thus, when the nitride semiconductor layer 25 is grown, the thickness to which the nitride semiconductor layer 25 can be grown without cracking may be increased. The nitride semiconductor layer 25 is a layer to be grown on the substrate 10 and may be formed of, for example, a nitride containing gallium. The nitride semiconductor layer 25 may be formed of $Al_xIn_yGa_{1-x-y}N$ ($0 \leq x, y \leq 1$, $x+y \leq 1$). For example, the nitride semiconductor layer 25 may be formed of a material including any one of GaN, InGaN, and AlInGaN. Alternatively, the nitride semiconductor layer 25 may be formed of a nitride that does not include aluminum.

Figure 3:
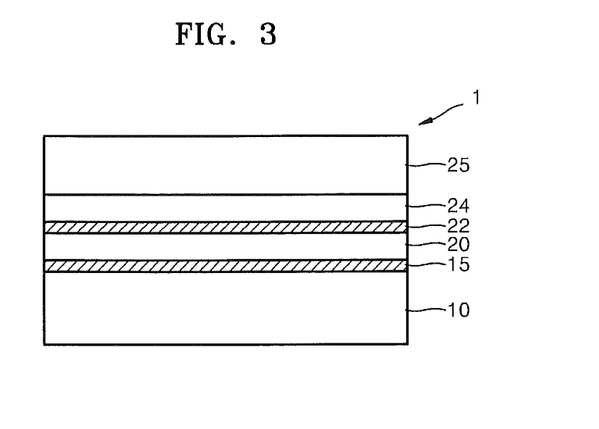
FIG. 3 is a cross-sectional view of another semiconductor device according to example embodiments of the present invention.

Referring to FIG. 3, a pre-seeding layer 22 (e.g., second pre-seeding layer) and a nucleation layer 24 (e.g., second nucleation layer) may be further disposed between the nucleation layer 20 and the nitride semiconductor layer 25. When the nucleation layer 20 is grown to a predetermined or desired thickness so that islands of the nucleation layer 20 have coalesced, the pre-seeding layer 22 may be formed on the nucleation layer 20, and the nucleation layer 24 may be grown on the pre-seeding layer 22, thereby reducing the tensile stress of the nucleation layer 24. For example, the thickness at which the nucleation layer 20 begins to coalesce may be equal to or greater than 10 nm.

Figure 4:
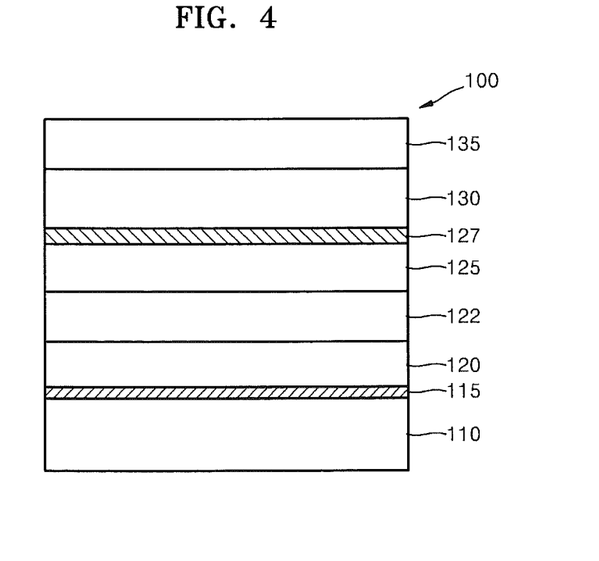
FIG. 4 is a cross-sectional view of another semiconductor device according to example embodiments of the present invention.

FIG. 4 is a cross-sectional view of a semiconductor device 100 according to example embodiments of the present invention. The semiconductor device 100 may include a substrate 110, a pre-seeding layer 115 disposed on the substrate 110, a nucleation layer 120 disposed on the pre-seeding layer 115, and at least one nitride semiconductor layer disposed on the nucleation layer 120. As described with reference to FIG. 2, the pre-seeding layer 115 may include a first material for pre-seeding and a second material for masking. The substrate 110, the nucleation layer 120, and the nitride semiconductor layer may have substantially the same functions, properties, and operations as the corresponding layers described with reference to FIG. 1. Thus, the description of those layers will be omitted for purposes of brevity. The nitride semiconductor layer may include, for example, a first nitride semiconductor layer 125, a second nitride semiconductor layer 130, and a third nitride semiconductor layer 135. The nitride semiconductor layer may be selectively undoped or doped. For example, the uppermost nitride semiconductor layer (e.g., the third nitride semiconductor layer 135) of the nitride semiconductor layer may be doped with n-type impurities or p-type impurities, while the other nitride semiconductor layers may be undoped. However, it should be understood that example embodiments are not limited thereto.

At least one buffer layer 122 may be further disposed between the nucleation layer 120 and the first nitride semiconductor layer 125. The buffer layer 122 may be formed of, for example, a material including any one selected from the group consisting of AlN, AlGaN, step graded $Al_xIn_yGa_{1-x-y}N$ ($0 \leq x, y \leq 1$, $x+y \leq 1$), and $Al_{x1}In_{y1}Ga_{1-x1-y1}N/Al_{x2}In_{y2}Ga_{1-x2-y2}N$ ($0 \leq x1, x2, y1, y2 \leq 1$, $x1 \neq x2$ or $y1 \neq y2$, $x1+y1 \leq 1$, $x2+y2 \leq 1$) superlattice. The buffer layer 122 may reduce dislocation due to mismatch of lattice constants between the substrate 110 and the first nitride semiconductor layer 125. As a result, the buffer layer 122 may prevent cracks from being generated due to a mismatch of thermal expansion coefficients between the substrate 110 and the first nitride semiconductor layer 125.

An inter layer 127 may be further disposed between the first nitride semiconductor layer 125 and the second nitride semiconductor layer 130. The inter layer 127 may compensate for a tensile stress generated by the first nitride semiconductor layer 125. The inter layer 127 may be formed of $Al_xGa_{1-x}N$ ($0<x<1$).

The substrate 110 may be removed during or after the manufacture of the semiconductor device 100, which may also be applicable to other non-limiting embodiments of the present invention described below.

The semiconductor device 100 may reduce the tensile stress by the pre-seeding layer 115 to reduce the generation of cracks when the nitride semiconductor layer is grown. A thickness to which the nitride semiconductor layer is grown may be increased by compensating for the tensile stress generated in the nitride semiconductor layer by the inter layer 127, and a thickness to which the nitride semiconductor layer is grown may be increased.

Figure 5:
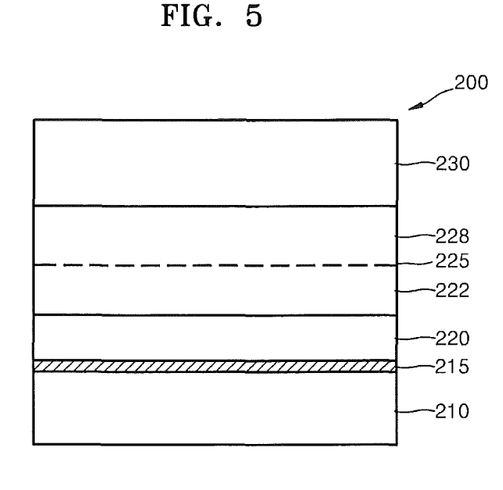
FIG. 5 is a cross-sectional view of another semiconductor device according to example embodiments of the present invention.

FIG. 5 is a cross-sectional view of a semiconductor device 200 according to example embodiments of the present invention. Referring to FIG. 5, the semiconductor device 200 may include a substrate 210, a pre-seeding layer 215 disposed on the substrate 210, a nucleation layer 220 disposed on the pre-seeding layer 215, and at least one nitride semiconductor layer disposed on the nucleation layer 220. The substrate 210, the pre-seeding layer 215, the nucleation layer 220, and the nitride semiconductor layer may have substantially the same functions, properties, and operations as the corresponding layers described with reference to FIGS. 1 and 2. Thus, the description of those layers will be omitted for purposes of brevity.

The nitride semiconductor layer may include, for example, a first nitride semiconductor layer 222, a second nitride semiconductor layer 228, and a third nitride semiconductor layer 230. The nitride semiconductor layer may be selectively undoped or doped. For example, the uppermost nitride semiconductor layer (e.g., the third nitride semiconductor layer 230) of the nitride semiconductor layer may be doped with n-type impurities or p-type impurities, while the other nitride semiconductor layers may be undoped. However, it should be understood that example embodiments are not limited thereto.

A masking layer 225 may be further disposed between the first nitride semiconductor layer 222 and the second nitride semiconductor layer 228. The masking layer 225 may be formed of silicon nitride ($SiN_x$) or titanium nitride (TiN). For example, a $SiN_x$ masking layer may be formed using silane ($SiH_4$) and an ammonia gas. The masking layer 225 may be formed partially on the nitride semiconductor layer so as to not completely cover the nitride semiconductor layer. Thus, according to a degree by which the masking layer 225 covers the nitride semiconductor layer, a region of the masking layer 225, for exposing the nitride semiconductor layer, may be determined, and a shape of an initial island that is grown on the nitride semiconductor layer may be determined. For example, when an area of a portion of the nitride semiconductor layer which is exposed is reduced by increasing the $SiN_x$ masking layer, a density of the initial island of the nitride semiconductor layer to be grown on the masking layer 225 is reduced, whereas the size of islands to be coalesced may be increased. In such a case, a thickness of the coalesced nitride semiconductor layer may be increased.

Figure 6:
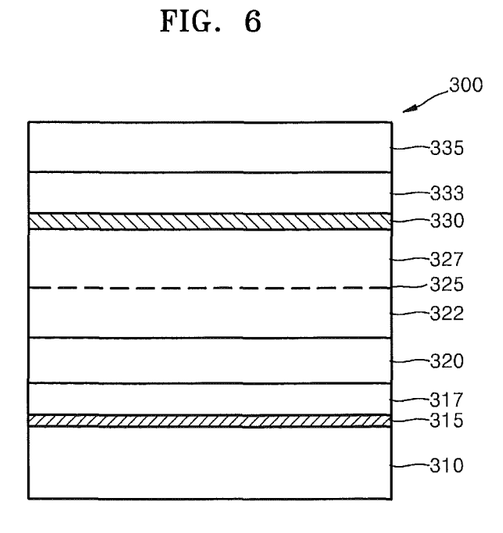
FIG. 6 is a cross-sectional view of another semiconductor device according to example embodiments of the present invention.

FIG. 6 is a cross-sectional view of a semiconductor device 300 according to example embodiments of the present invention. Referring to FIG. 6, the semiconductor device 300 may include a substrate 310, a pre-seeding layer 315 disposed on the substrate 310, a nucleation layer 317 disposed on the pre-seeding layer 315, and at least one nitride semiconductor layer disposed on the nucleation layer 317. The nitride semiconductor layer may include, for example, a first nitride semiconductor layer 322, a second nitride semiconductor layer 327, a third nitride semiconductor layer 333, and a fourth nitride semiconductor layer 335. The nitride semiconductor layer may be undoped or doped. For example, the uppermost nitride semiconductor layer (e.g., the fourth nitride semiconductor layer 335) of the nitride semiconductor layer may be doped with n-type impurities or p-type impurities, while the other nitride semiconductor layers may be undoped. However, it should be understood that example embodiments are not limited thereto.

A buffer layer 320 may be further disposed between the nucleation layer 317 and the first nitride semiconductor layer 322. At least one masking layer 325 and at least one inter layer 330 may be disposed between the first nitride semiconductor layer 322 and the third nitride semiconductor layer 333. The inter layer 330 may be disposed above the masking layer 325. The masking layer 325 and the inter layer 330 may not directly contact each other, and a nitride semiconductor layer (e.g., second nitride semiconductor layer 327) may be disposed between the masking layer 325 and the inter layer 330. A pair of a masking layer and an inter layer may be disposed between a plurality of nitride semiconductor layers. Alternatively, a plurality of pairs of masking layers and inter layers may be alternately disposed between a plurality of nitride semiconductor layers.

According to example embodiments, the pre-seeding layer 315 may reduce tensile stress. Prior to the formation of the masking layer 325, the pre-seeding layer 315 may reduce a dislocation density at an interface between the buffer layer 320 and the first nitride semiconductor layer 322. In addition, the masking layer 325 may be formed on the first nitride semiconductor layer 322, thereby reinforcing the dislocation density. Since the inter layer 330 may adequately reduce the dislocation density, an effect of reducing the dislocation density of the masking layer 325 may be maintained or increased. In addition, the inter layer 330 may compensate for the tensile stress, thereby reducing or preventing cracks.

Figure 7:
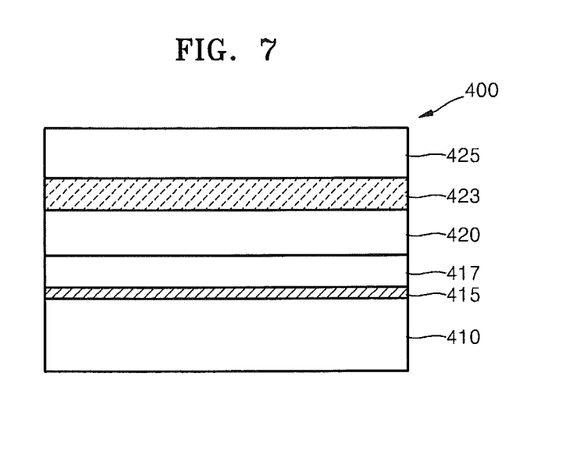
FIGS. 7 and 8 are cross-sectional views of structures where a semiconductor device is applied to a light-emitting device according to example embodiments of the present invention.

FIG. 7 is a cross-sectional view of a structure where a semiconductor device 400 is used as a light-emitting device, according to example embodiments of the present invention. Referring to FIG. 7, the semiconductor device 400 may include a substrate 410, a pre-seeding layer 415 disposed on the substrate 410, a nucleation layer 417 disposed on the pre-seeding layer 415, and at least one nitride semiconductor layer disposed on the nucleation layer 417. For example, a first nitride semiconductor layer 420 and a second nitride semiconductor layer 425 may be disposed on the nucleation layer 417. In addition, an active layer 423 may be disposed between the first nitride semiconductor layer 420 and the second nitride semiconductor layer 425. The first nitride semiconductor layer 420 may be doped with first-type impurities, for example, n-type impurities. The second nitride semiconductor layer 425 may be doped with second-type impurities, for example, p-type impurities. The active layer 423 may emit light as energy based on an energy band gap of the active layer 423 when electrons and holes are combined. The active layer 423 may include, for example, a multiple quantum well. Each of the first nitride semiconductor layer 420 and the second nitride semiconductor layer 425 may include a single layer or a plurality of layers, and may be selectively undoped or doped.

Figure 8:
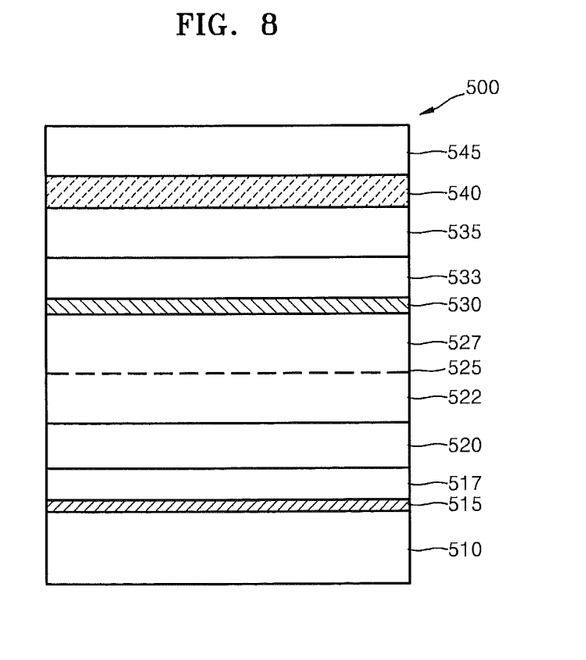

FIG. 8 is a cross-sectional view of a structure where the semiconductor device 300 of FIG. 6 is applied to a light-emitting device, according to example embodiments of the present invention. Referring to FIG. 8, a semiconductor device 500 may include a substrate 510, a pre-seeding layer 515 on the substrate 510, a nucleation layer 517 on the pre-seeding layer 515, and at least one nitride semiconductor layer on the nucleation layer 517. The nitride semiconductor layer may include, for example, a first nitride semiconductor layer 522, a second nitride semiconductor layer 527, a third nitride semiconductor layer 533, a fourth nitride semiconductor layer 535, and a fifth nitride semiconductor layer 545. The nitride semiconductor layer may be selectively undoped or doped. For example, the fourth nitride semiconductor layer 535 may be doped with n-type impurities, and the fifth nitride semiconductor layer 545 may be doped with p-type impurities. An active layer 540 may be disposed between the fourth nitride semiconductor layer 535 and the fifth nitride semiconductor layer 545.

A buffer layer 520 may be further disposed between the nucleation layer 517 and the first nitride semiconductor layer 522. At least one masking layer 525 and at least one inter layer 530 may be disposed between the first nitride semiconductor layer 522 and the third nitride semiconductor layer 533. The inter layer 530 may be disposed above the masking layer 525. The masking layer 525 and the inter layer 530 may not directly contact each other, and a nitride semiconductor layer (e.g., second nitride semiconductor layer 527) may be disposed between the masking layer 525 and the inter layer 530.

A semiconductor device according to example embodiments of the present invention may include a nitride thin film grown on a Si substrate or a SiC substrate to a desired thickness by reducing lattice dislocations and tensile stress. Also, a relatively large wafer may be manufactured by using a Si substrate or a SiC substrate. The semiconductor device may be used in a light-emitting diode, a short key diode, a laser diode, a field effect transistor, or a power device, although example embodiments are not limited thereto.

Figure 9A:
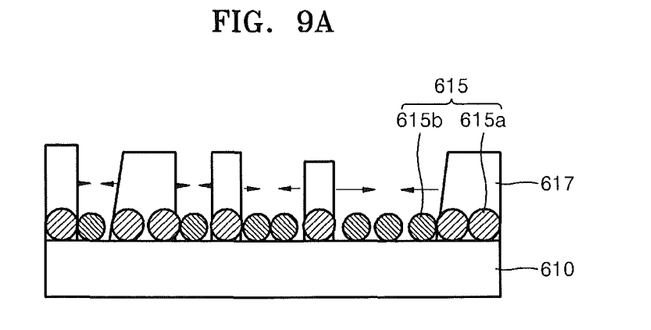
FIGS. 9A and 9B are cross-sectional views of a method of manufacturing a semiconductor device according to example embodiments of the present invention.

Hereinafter, a method of manufacturing a semiconductor device, according to example embodiments of the present invention, will be described. Referring to FIG. 9A, a pre-seeding layer 615 is formed on a substrate 610. The substrate 610 may be a silicon-based substrate. In order to form the pre-seeding layer 615, a source of a first material 615a for pre-seeding and a source of a second material 615b for masking may be injected to a reactor. For example, Al as the first material 615a and Mg or Si as the second material 615b may be injected. After the pre-seeding layer 615 is formed on the substrate 610, a material for nucleation may be injected into the reactor. For example, Al and $NH_3$ gases may be injected. The $NH_3$ gas may react with the Al to form AlN, and thus a nucleation layer 617 may be formed. The remaining $NH_3$ gas may react with Mg or Si to form $MgN_x$ or $SiN_x$. $MgN_x$ or $SiN_x$ does not grow on an AlN thin film since a metal of Group III has a relatively low adhesive force.

However, if a lattice constant of the nucleation layer 617 is smaller than that of the substrate 610, a tensile stress may be applied to the nucleation layer 617 grown on the substrate 610. The tensile stress may generate cracks if a nitride semiconductor layer is grown on the nucleation layer 617 at a relatively high temperature and is cooled at room temperature. Thus, cracks may be prevented or reduced by reducing the tensile stress. When a contact area between the substrate 610 and the nucleation layer 617 is small, the tensile stress may be reduced. Thus, the contact area between the substrate 610 and the nucleation layer 617 may be reduced by partially growing the nucleation layer 617 on the pre-seeding layer 615, thereby reducing the tensile stress of the nucleation layer 617.

In order to form the nucleation layer 617, when Al and $NH_3$ gases are injected, the second material 615b, for example, Mg or Si, may be injected together. Thus, while the tensile stress is continuously reduced, the nucleation layer 617 may be grown.

Figure 9B:
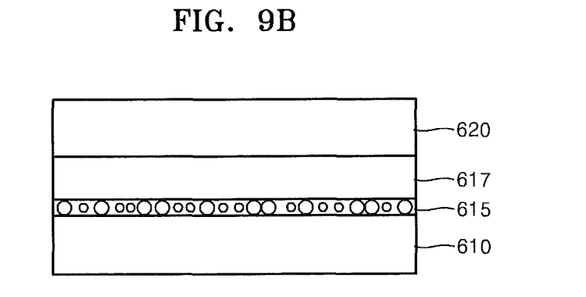

The nucleation layer 617 may be grown on the first material 615a and then may be coalesced to form a thin film. As shown in FIG. 9B, a nitride semiconductor layer 620 may be grown on the nucleation layer 617. Alternatively, when islands of the nucleation layer 617 have coalesced to form a thin film, another pre-seeding layer (e.g., pre-seeding layer 22 of FIG. 3) may be formed on the nucleation layer 617, and another nucleation layer (e.g., nucleation layer 24 of FIG. 3) may be formed on the pre-seeding layer. When the islands of the nucleation layer 617 are coalesced to form a thin film, a nucleation layer may be grown by injecting a first material for nucleation together with a second material for masking. For example, when the nucleation layer 617 is grown to a thickness of about 10 nm or more, the islands of the nucleation layer 617 are coalesced to form a thin film. Once the islands of the nucleation layer 617 have coalesced, the nucleation layer 617 may be continuously grown by further injecting the second material 615b. The tensile stress may be further reduced by further injecting the second material 615b during the growing of the nucleation layer 617.

Figure 10:
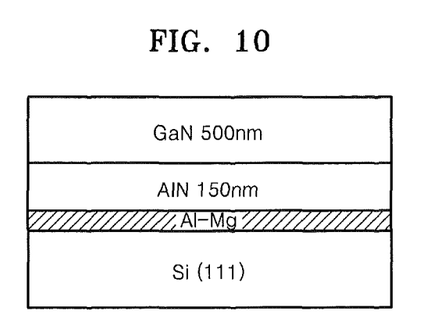
FIG. 10 is a cross-sectional view of another semiconductor device according to example embodiments of the present invention.
Figure 11:
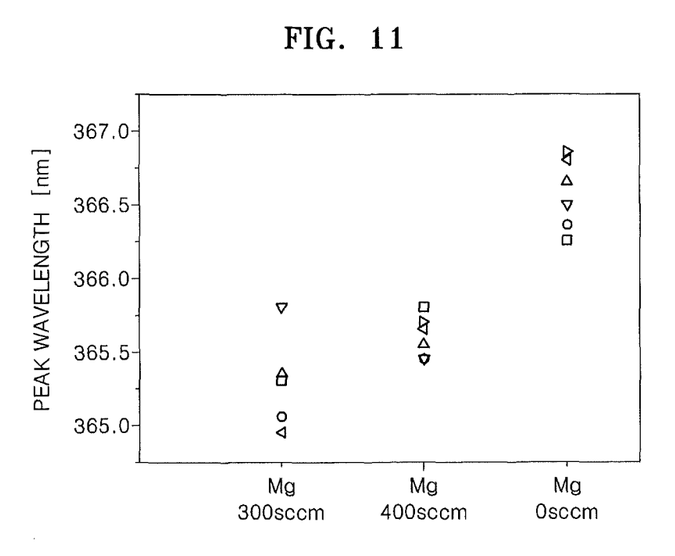
FIG. 11 is a graph showing a change in a peak wavelength of light that is emitted to the semiconductor device of FIG. 10 and then reflected versus an injection amount of Mg of a pre-seeding layer in the semiconductor device.

In FIG. 10, a Al—Mg pre-seeding layer is disposed on a Si substrate, and an AlN layer with a thickness of 150 nm and a GaN layer with a thickness of 500 nm are disposed on the Al—Mg pre-seeding layer. FIG. 11 is a graph showing a change in a peak wavelength of light that is emitted to the semiconductor device of FIG. 10 and then reflected, according to an injection amount of Mg of a pre-seeding layer in the semiconductor device. Compared to a case where Mg is not injected, a peak wavelength of a case where Mg is injected was reduced. Reduction in peak wavelength may indicate that a tensile stress is reduced. Thus, tensile stress may be reduced when a pre-seeding layer includes a material for masking. Likewise, a thickness of a nitride semiconductor layer may be increased without cracks by reducing the tensile stress of a nucleation layer.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. Descriptions of features or aspects within each embodiment should typically be considered as available for other similar features or aspects in other embodiments.

What is claimed is:

1. A semiconductor device comprising:
a pre-seeding layer comprising a first material and a second material distinct from the first material, the first material having properties that facilitate pre-seeding and the second material having properties that facilitate masking;
a nucleation layer on the pre-seeding layer;
a plurality of nitride semiconductor layers on the nucleation layer,
at least one masking layer between the plurality of nitride semiconductor layers; and
at least one inter layer between the plurality of nitride semiconductor layers, the at least one inter layer being on the at least one masking layer, the at least one inter layer configured to compensate for a tensile stress,
wherein the at least one inter layer comprises a material selected from the group consisting of $Al_{x0}In_{y0}Ga_{1-x0-y0}N$ ($0 \leq x0$, $y0 \leq 1$, $x0+y0 \leq 1$), step graded $Al_xIn_yGa_{1-x-y}N$ ($0 \leq x$, $y \leq 1$, $x+y \leq 1$), and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$) superlattice.

2. The semiconductor device of claim 1, wherein the first material comprises aluminum (Al).

3. The semiconductor device of claim 1, wherein the second material comprises magnesium (Mg) or silicon (Si).

4. The semiconductor device of claim 1, wherein the plurality of nitride semiconductor layers comprise a nitride containing gallium.

5. The semiconductor device of claim 1, wherein the nucleation layer comprises AlN.

6. The semiconductor device of claim 1, further comprising:
at least one buffer layer between the nucleation layer and the plurality of nitride semiconductor layers.

7. The semiconductor device of claim 6, wherein the at least one buffer layer comprises $Al_xIn_yGa_{1-x-y}N$ ($0 \leq x$, $y \leq 1$, $x+y \leq 1$).

8. The semiconductor device of claim 1, wherein the at least one masking layer comprises silicon nitride ($SiN_x$) or titanium nitride (TiN).

9. The semiconductor device of claim 1, further comprising:
a substrate below the plurality of nitride semiconductor layers.

10. The semiconductor device of claim 9, wherein the substrate comprises a silicon (Si) substrate or a silicon carbide (SiC) substrate.

11. The semiconductor device of claim 1, wherein the nucleation layer comprises Mg or Si.

12. A semiconductor device comprising:
a first pre-seeding layer comprising a first material and a second material distinct from the first material, the first material having properties that facilitate pre-seeding and the second material having properties that facilitate masking;
a first nucleation layer on the first pre-seeding layer;
a second pre-seeding layer on the first nucleation layer, the second pre-seeding layer comprising the first material that facilitates pre-seeding and the second material that facilitates masking; and
a second nucleation layer on the second pre-seeding layer.

13. A method of manufacturing a semiconductor device, the method comprising:
growing a pre-seeding layer on a substrate, the pre-seeding layer comprising a first material and a second material distinct from the first material, the first material having properties that facilitate pre-seeding and the second material having properties that facilitate masking;
growing a nucleation layer on the pre-seeding layer; and
growing a nitride semiconductor layer on the nucleation layer,
wherein the growing of the nucleation layer comprises injecting Al, Mg, and $NH_3$ sources into a reactor, or injecting Al, Si, and $NH_3$ sources into the reactor.

14. The method of claim 13, wherein the first material comprises Al.

15. The method of claim 13, wherein the second material comprises Mg or Si.

16. The method of claim 13, wherein the nitride semiconductor layer comprises a nitride containing gallium.

17. The method of claim 13, wherein the nucleation layer comprises AlN.

18. The method of claim 13, further comprising:
    growing at least one buffer layer between the nucleation layer and the nitride semiconductor layer.

19. The method of claim 13, further comprising:
    growing at least one masking layer between the nucleation layer and the nitride semiconductor layer.

20. The method of claim 19, wherein the at least one masking layer comprises silicon nitride ($SiN_x$) or titanium nitride (TiN).

21. The method of claim 19, further comprising:
    growing at least one inter layer on the at least one masking layer to compensate for a tensile stress.

22. The method of claim 21, wherein the at least one inter layer comprises a material selected from the group consisting of $Al_{x0}In_{y0}Ga_{1-x0-y0}N$ ($0 \leq x0$, $y0 \leq 1$, $x0+y0 \leq 1$), step graded $Al_xIn_yGa_{1-x-y}N$ ($0 \leq x$, $y \leq 1$, $x+y \leq 1$), and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$) superlattice.

23. The method of claim 13, further comprising:
    removing the substrate.

24. The method of claim 13, wherein the substrate comprises a silicon (Si) substrate or a silicon carbide (SiC) substrate.

25. The method of claim 13, wherein growing the nucleation layer comprises injecting the second material for masking during growth of the nucleation layer.

* * * * *